United States Patent
Shih et al.

(10) Patent No.: US 7,128,134 B2
(45) Date of Patent: Oct. 31, 2006

(54) HEAT DISSIPATION MODULE

(75) Inventors: Jung-Sung Shih, Taoyuan Hsien (TW); Wei-Fang Wu, Taoyuan Hsien (TW); Yu-Hung Huang, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/981,697

(22) Filed: Nov. 5, 2004

(65) Prior Publication Data

US 2005/0211419 A1  Sep. 29, 2005

(30) Foreign Application Priority Data

Mar. 26, 2004  (TW)  ................ 93108273 A

(51) Int. Cl.
*F28D 15/04* (2006.01)

(52) U.S. Cl. ............... 165/104.26; 165/104.33

(58) Field of Classification Search ........... 165/104.33, 165/104.21, 104.26, 80.4; 361/697, 699, 361/700, 704; 174/15.1, 15.2; 257/714–716
See application file for complete search history.

(56) References Cited

U.S. PATENT DOCUMENTS

| | | | | |
|---|---|---|---|---|
| 5,000,256 A | * | 3/1991 | Tousignant | ................ 165/46 |
| 5,411,077 A | * | 5/1995 | Tousignant | ............ 165/104.33 |
| 5,485,671 A | * | 1/1996 | Larson et al. | .......... 29/890.032 |
| 6,082,443 A | * | 7/2000 | Yamamoto et al. | .... 165/104.26 |
| 6,227,287 B1 | * | 5/2001 | Tanaka et al. | ............. 165/80.4 |
| 6,263,959 B1 | * | 7/2001 | Ikeda et al. | ............ 165/104.26 |
| 6,269,866 B1 | * | 8/2001 | Yamamoto et al. | .... 165/104.26 |
| 6,317,322 B1 | * | 11/2001 | Ueki et al. | .................. 361/700 |
| 6,840,311 B1 | * | 1/2005 | Ghosh et al. | .......... 165/104.33 |
| 6,918,431 B1 | * | 7/2005 | Reyzin et al. | ......... 165/104.21 |

FOREIGN PATENT DOCUMENTS

TW  540983  *  7/1992

* cited by examiner

*Primary Examiner*—Teresa J. Walberg
(74) *Attorney, Agent, or Firm*—Birch, Stewart, Kolasch & Birch, LLP

(57) ABSTRACT

A heat dissipation module is disclosed for providing good heat-dissipating efficiency. First and second cases correspond to each other, with a heat conducting structure connecting to an opening of the second case. The first and second cases and the heat conducting structure form a closed structure with a porous structure therein.

13 Claims, 2 Drawing Sheets

HEAT DISSIPATION MODULE

BACKGROUND

The present invention relates to a heat dissipation module and in particular to a heat dissipation module with reduced weight.

Precision electrical components often generate excess heat which cannot be dissipated by natural or forced convection. For accelerated dissipation of heat from the electrical components, a heat sink is typically disposed on heat sources, with the heat dissipated more thoroughly via fins thereof.

Heat sinks using fans still have limitations dissipating heat rapidly. For example, the temperature difference of the airflow between the surfaces of fins and the heat sink is only 5–10° C., whereby insufficient temperature gradient and heat resistance generated by the material and structure of the heat sink may reduce the heat dissipation efficiency of the fins below 70%. Thus, the typical heat sink is limited in heat dissipation efficiency.

FIGS. 1A and 1B show a conventional heat dissipation module 10. The heat dissipation module 10 comprises upper and lower cases 12 and 14 connected to each other. The cases 12 and 14 have porous structure 18 on the inner surfaces thereof, which is create by sintering and impregnated with liquid. The space between cases 12 and 14 is evacuated before sealing, creating a vapor chamber. When a heat source (such as a CPU) 16 generates heat and transmitted to the heat dissipation module 10, the liquid in the porous structure 18 of the lower case 14 is vaporized and rises to the upper case 12. Meanwhile, a fan (not shown) is disposed outside the upper case 12 such that vapor liquid in the porous structure 18 of the upper case 12 is condensed, and flows down to the porous structure 18 of lower case 14, completing an operation cycle for the heat dissipation module 10. Since the surface areas of the cases 12 and 14 exceed the surface area of the heat source, heat is dissipated.

However, to meet requirements for structural strength when contacting heat source 16, the wall of the lower case 14 must be thick enough to be processed (as shown in FIG. 1B). The contact area between the heat dissipation module 10 and the heat source 16 is part of the lower case 14. The lower case 14 can deform from its own weight after prolonged use, resulting in incomplete or interrupted contact with heat source 16, decreasing heat dissipation. As thickness of the heat dissipation module 10 is increased, weight increases accordingly, such that an electronic device utilizing the heat dissipation module 10 cannot meet small scale requirements.

Another heat dissipation module 20 is therefore disclosed as shown in FIG. 1C. The difference between heat dissipation modules 10 and 20 is that the lower case 24 is thinner to decrease the weight of the heat dissipation module 10. The outer surface of the lower case 14 is welded with a metal plate 22 to contact the heat source 16, providing sufficient structural strength. The surface area of the lower case 24 exceeds the surface area of the metal plate 22, and the surface area of the metal plate 22 exceeds the surface area of the heat source 16.

However, while this method decreases weight of the heat dissipation module 20, a welding layer 28 is required between the metal plate 22 and the lower case 24. The welding layer 28 increases heat resistance between the heat source 16 and the heat dissipation module 20, decreasing heat dissipation efficiency.

SUMMARY

Embodiments of the present invention provide a heat dissipation module comprising a first case, a second case with an opening, a heat conducting structure, and a plurality of porous structure. The cases correspond to each other and form a closed structure with the heat conducting structure. The porous structure is disposed on an inner surface of the closed structure.

Embodiments of the present invention provide a heat dissipation module with reduced weight and space consumption. The structure of heat dissipation module is simplified while providing sufficient structural strength to connect with the heat source. Heat from the heat source does not pass through the welding layer, avoiding heat resistance therefrom.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

A detailed description is given in the following embodiment, and devices and elements common with a conventional heat dissipation module are omitted.

First Embodiment

Figure 1A:
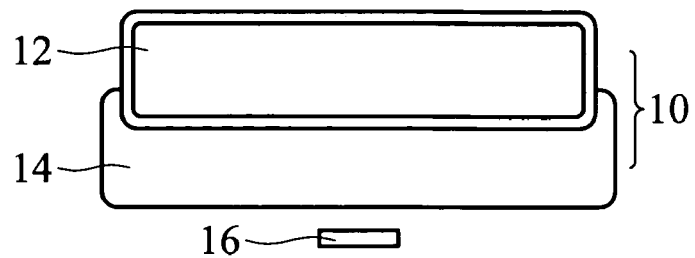
FIG. 1A is a schematic view of a conventional heat dissipation module.
Figure 1B:
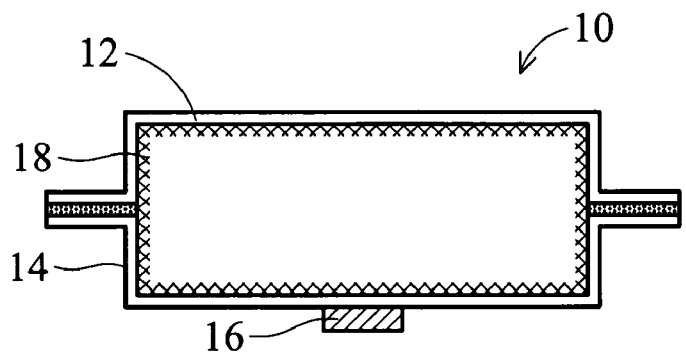
FIG. 1B is another schematic view of the conventional heat dissipation module
Figure 1C:
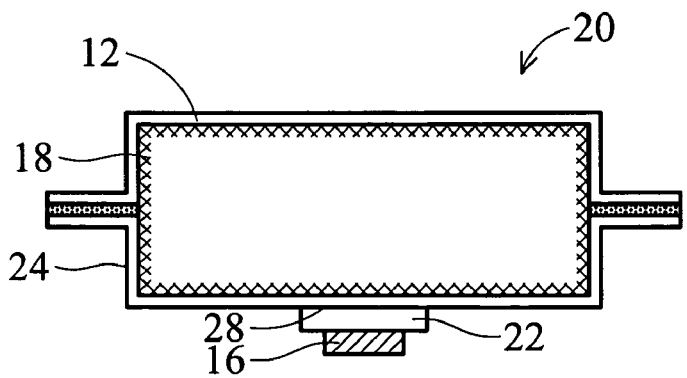
FIG. 1C is a schematic view of yet another conventional heat dissipation module.
Figure 2A:
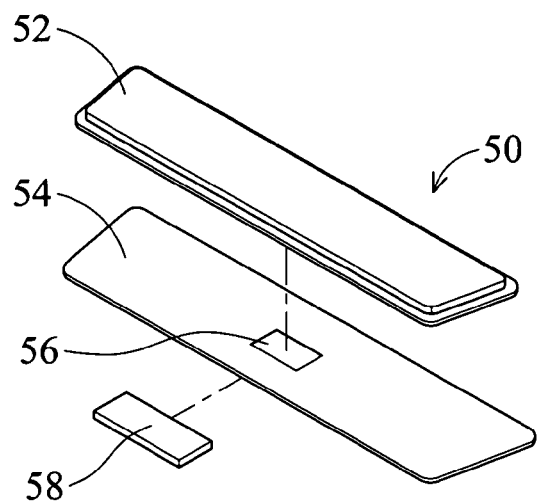
FIG. 2A is a schematic view of a heat dissipation module of a first embodiment of the invention.
Figure 2B:
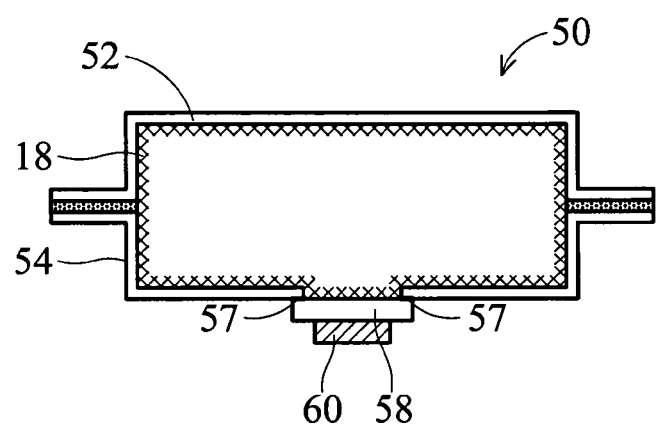
FIG. 2B is another schematic view of the heat dissipation module.

FIG. 2A shows a first embodiment of a heat dissipation module 50 of the invention. FIG. 2B is a side view of the heat dissipation module 50. The heat dissipation module 50 comprises an upper case 52, a lower case 54, and a heat conducting structure such as a heat conducting plate 58. Cases 52 and 54, of metal, correspond to each other and vary with requirements, such as having a U-shaped or other structure corresponding to heat sources.

The lower case 54 comprises an opening 56 with profile corresponding to a heat source 60, in this case a CPU. The surface area of the opening 56 exceeds or substantially equals the surface area of the heat source 60.

The inner surfaces of cases 52 and 54 and the top of heat conducting plate 58 bear a porous structure (wicking structure) 18 thereon. The porous structure 18 is formed by sintering, adhering, filling or depositing, and then impregnated with liquid. The porous structure 18 is plastic, metal or alloy (such as copper, aluminum, iron) or porous nonmetallic material. The cases 52 and 54 and the heat conducting plate 58 are connected to form a closed structure, with the porous structure 18 therein. The interior of the closed structure thus forms a vapor chamber.

The shape of the porous structure 18 can be mesh, fiber, sintered or grooved structure to impregnate a liquid. The liquid maybe an inorganic compound, water, alcohol, liquid metal (such as mercury), ketone, refrigerant, or organic compound. The surface area of the heat conducting plate 58 exceeds the surface area of the opening 56 of the lower case 54. Thus, when the heat conducting plate 58 is connected to the lower case 54 by welding, fusing, or adhering, the connection is at the edge of the heat conducting plate 58, forming a connecting portion 57.

Second Embodiment

Figure 2C:
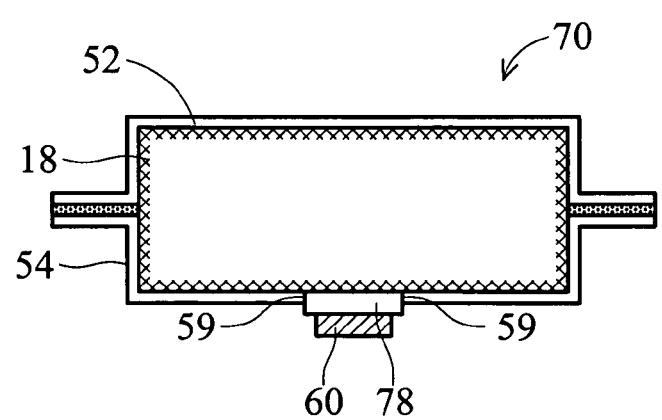
FIG. 2C is a schematic view of a heat dissipation module of a second embodiment of the invention.

FIG. 2C shows a second embodiment of a heat dissipation module 70 of the invention, with similarities to the previous embodiment omitted. The difference from the first embodiment is that the surface area of the heat conducting plate 78 is substantially equal to that of the opening 56. Thus, when the heat conducting plate 78 is connected to the lower case 54 by welding, fusing, or adhering, the connection is at the edge of the heat conducting plate 78, forming a connecting portion 59. After the cases 52 and 54 of the heat dissipation module 50 and 70 are shaped to required profiles, the porous structure 18 is created on the inner of the cases 52 and 54 and the top of the heat conducting plate 58 and 78 (except connecting portion 57). Thus, heat conducting plates 58 and 78 are disposed between the lower case 54 and the heat source 60, such that lower case 54 is not deformed by the weight of the heat dissipation module and can therefore be thin metal. The total weight of the heat dissipation module is thus reduced.

Moreover, the profile of the opening 56 is not limited as mentioned, providing the area of the opening 56 covers the area of the heat source 60. Further, heat conducting plates 58 and 78 are neither limited as mentioned. The heat conducting plates 58 and 78 may have recessed, relief, or other structure, provided the heat conducting structure can cover opening 56 and provide sufficient structural strength.

Because of the opening 56 and the heat conducting structure, heat generated from the heat source is transmitted through the heat conducting structure to the vapor chamber. The surface of the heat source completely contacts the heat dissipation module, without passing through the conventional welding layer to maintain maximum dissipation efficiency.

While the invention has been described by way of example and in terms of the preferred embodiments, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation module, comprising:
   a first case;
   a second case comprising an opening, the second case corresponding to the first case;
   a heat conducting structure connected to the opening of the second case and not connected to the first case; and
   a porous structure;
   wherein the first case, the second case and the heat conducting structure form a closed structure and the porous structure is continuously disposed on an inner surface defined by the first case, the second case and the heat conducting structure.

2. The heat dissipation module as claimed in claim 1, wherein the surface area of the heat conducting structure exceeds the surface area of the opening.

3. The heat dissipation module as claimed in claim 1, wherein the surface area of the heat conducting structure substantially equals the surface area of the opening.

4. The heat dissipation module as claimed in claim 1, wherein the heat conducting structure and the second case are connected by welding, fusing, or adhering.

5. The heat dissipation module as claimed in claim 1, wherein the thickness of the heat conducting structure exceeds the thickness of the second case.

6. The heat dissipation module as claimed in claim 1, wherein the porous structure is impregnated with liquid.

7. The heat dissipation module as claimed in claim 6, wherein the liquid comprises an inorganic compound, water, alcohol, liquid metal, ketone, refrigerant, or organic compound.

8. The heat dissipation module as claimed in claim 1, wherein the porous structure is plastic, metal, alloy, or porous nonmetallic material.

9. The heat dissipation module as claimed in claim 1, wherein the porous structure has a mesh, fiber, sintered, or grooved structure.

10. The heat dissipation module as claimed in claim 1, wherein the porous structure and the closed structure are connected by sintering, adhering, filling, or depositing.

11. The heat dissipation module as claimed in claim 1, wherein the heat conducting structure contacts a heat source, the surface area of the heat source is less than or equal to the surface area of the opening.

12. The heat dissipation module as claimed in claim 1, wherein a connecting portion is formed at the edge of the heat conducting structure, thereby the heat conducting structure is connected to the second case.

13. The heat dissipation module as claimed in claim 1, wherein a connecting portion is formed at the periphery of the heat conducting structure, thereby the heat conducting structure is connected to the second case.

* * * * *